US011424405B2

United States Patent
Wang et al.

(10) Patent No.: US 11,424,405 B2
(45) Date of Patent: Aug. 23, 2022

(54) POST TREATMENT TO REDUCE SHUNTING DEVICES FOR PHYSICAL ETCHING PROCESS

(71) Applicant: Taiwan Semiconductor Manufacturing Company, Ltd., Hsinchu (TW)

(72) Inventors: Yu-Jen Wang, San Jose, CA (US); Dongna Shen, San Jose, CA (US); Vignesh Sundar, Sunnyvale, CA (US); Sahil Patel, Fremont, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 16/915,522

(22) Filed: Jun. 29, 2020

(65) Prior Publication Data
US 2020/0328345 A1   Oct. 15, 2020

Related U.S. Application Data

(63) Continuation of application No. 16/416,984, filed on May 20, 2019, now Pat. No. 10,700,269, which is a
(Continued)

(51) Int. Cl.
*H01L 43/12* (2006.01)
*H01L 21/033* (2006.01)
(Continued)

(52) U.S. Cl.
CPC .......... *H01L 43/12* (2013.01); *H01L 21/0337* (2013.01); *H01L 21/311* (2013.01); *H01L 21/3105* (2013.01); *H01L 23/62* (2013.01)

(58) Field of Classification Search
CPC ......... H01L 21/0223–02244; H01L 21/02249; H01L 21/02252; H01L 21/02614;
(Continued)

(56) References Cited

U.S. PATENT DOCUMENTS

| 6,798,626 B2 | 9/2004 | Hayashi et al. |
| 7,043,823 B2 | 5/2006 | Childress et al. |

(Continued)

FOREIGN PATENT DOCUMENTS

| DE | 102004034822 A1 | 3/2005 |
| JP | 63055956 | 3/1988 |
| WO | WO2015/136723 | 9/2015 |

OTHER PUBLICATIONS

PCT Search Report, International Application No. PCT/US2018/021452, Applicant: Headway Technologies, Inc., dated Jul. 20, 2018, 12 pages.

*Primary Examiner* — Sonya McCall-Shepard
(74) *Attorney, Agent, or Firm* — Haynes and Boone, LLP

(57) ABSTRACT

A method for etching a magnetic tunneling junction (MTJ) structure is described. A stack of MTJ layers is provided on a bottom electrode. A top electrode is provided on the MTJ stack. The top electrode is patterned. Thereafter, the MTJ stack not covered by the patterned top electrode is oxidized or nitridized. Then, the MTJ stack is patterned to form a MTJ device wherein any sidewall re-deposition formed on sidewalls of the MTJ device is non-conductive and wherein some of the dielectric layer remains on horizontal surfaces of the bottom electrode.

20 Claims, 1 Drawing Sheet

Related U.S. Application Data continuation of application No. 15/479,514, filed on Apr. 5, 2017, now Pat. No. 10,297,746.

(51) Int. Cl.
- *H01L 21/3105* (2006.01)
- *H01L 21/311* (2006.01)
- *H01L 23/62* (2006.01)
- *H01L 21/306* (2006.01)
- *H01L 43/08* (2006.01)

(58) Field of Classification Search
CPC . H01L 21/164; H01L 21/02323–02326; H01L 21/76855; H01L 21/76888; H01L 21/02247; H01L 21/308–3088; H01L 21/31144; H01L 21/32; H01L 21/32139; H01L 21/467; H01L 21/475; H01L 21/469–47576; H01L 21/02013; H01L 21/02024; H01L 21/2633; H01L 21/304–3046; H01L 21/32131–32132; H01L 21/463; H01L 21/4842; H01L 21/3063–30635; H01L 21/32125; H01L 21/465; H01L 21/3065–30655; H01L 21/31116; H01L 21/31122; H01L 21/31138; H01L 21/67069; H01L 21/32136–32137; H01L 21/02071; H01L 21/3211; H01L 21/3165–31687; H01L 21/32105; H01L 21/02318–02362; H01L 21/02664–02694; H01L 21/0337; H01L 21/311; H01L 21/306; C23F 1/00–46; C25F 3/02–14; C23C 14/58–5893; C23C 16/56

See application file for complete search history.

(56) References Cited

U.S. PATENT DOCUMENTS

| | | | |
|---|---|---|---|
| 7,936,027 B2 * | 5/2011 | Xiao | H01L 43/12 257/421 |
| 8,045,299 B2 | 10/2011 | Fontana, Jr. et al. | |
| 8,673,654 B2 | 3/2014 | Hong et al. | |
| 8,981,507 B2 | 3/2015 | Takahashi et al. | |
| 8,993,352 B2 | 3/2015 | Nishimura et al. | |
| 9,130,158 B1 * | 9/2015 | Shen | H01L 43/12 |
| 9,257,638 B2 | 2/2016 | Tan et al. | |
| 9,472,753 B1 | 10/2016 | Katine | |
| 9,589,838 B2 | 3/2017 | Wang et al. | |
| 2003/0180968 A1 | 9/2003 | Nallan et al. | |
| 2011/0104881 A1 | 5/2011 | Lee et al. | |
| 2013/0001652 A1 | 1/2013 | Yoshikawa et al. | |
| 2013/0248355 A1 | 9/2013 | Ohsawa et al. | |
| 2014/0295579 A1 | 10/2014 | Guo | |
| 2014/0299951 A1 | 10/2014 | Guo | |
| 2015/0311432 A1 | 10/2015 | Nakagawa et al. | |
| 2016/0079308 A1 | 3/2016 | Ito | |
| 2016/0087195 A1 | 3/2016 | Sonoda | |
| 2016/0336509 A1 | 11/2016 | Jeong et al. | |
| 2016/0351798 A1 * | 12/2016 | Shen | H01L 43/12 |
| 2018/0294405 A1 | 10/2018 | Wang et al. | |
| 2019/0280197 A1 | 9/2019 | Wang et al. | |

\* cited by examiner

POST TREATMENT TO REDUCE SHUNTING DEVICES FOR PHYSICAL ETCHING PROCESS

PRIORITY DATA

The present application is a continuation application of U.S. application Ser. No. 16/416,984, filed May 20, 2019, which is a continuation application of U.S. application Ser. No. 15/479,514, filed Apr. 5, 2017, each of which is incorporated herein by reference in its entirety.

TECHNICAL FIELD

This application relates to the general field of magnetic tunneling junctions (MTJ) and, more particularly, to etching methods for forming MTJ structures.

BACKGROUND

A typical MTJ etched by a chemical etching process is found to have sidewall damage, possibly caused by oxygen or other chemicals during the etching process. Pure physical etching processes such as ion beam etching (IBE) can minimize sidewall damage. However, one drawback of the physical etching process is the sidewall re-deposition of material from the bottom electrode and MTJ materials to the MTJ sidewalls. The sidewall re-deposition of the bottom electrode will lead to a shunting path around the MTJ sidewall and then lead to low yield for the MRAM chip.

Several patents teach methods to reduce shunting. These include U.S. Pat. No. 9,257,638 (Tan et al), U.S. Pat. No. 7,043,823 (Childress et al), U.S. Pat. No. 8,981,507 (Takahashi et al), U.S. Pat. No. 6,798,626 (Hayashi et al), U.S. Pat. No. 8,045,299 (Fontana, Jr et al), U.S. Pat. No. 8,673,654 (Hong et al) and U.S. Patent Application 2016/0079308 (Ito). U.S. Pat. No. 8,045,299 (Fontana, Jr et al—HGST) teaches etching and then oxidizing the MTJ stack or adding ozone or water to the etching process to oxidize the re-depositing material.

SUMMARY

It is an object of the present disclosure to provide an improved etching process in forming MTJ structures.

Yet another object of the present disclosure is to provide an etching process that reduces shunting of MTJ devices.

In accordance with the objectives of the present disclosure, a method for etching a magnetic tunneling junction (MTJ) structure is achieved. A stack of MTJ layers is provided on a bottom electrode. A top electrode is provided on the MTJ stack. The top electrode is patterned. Thereafter, the MTJ stack not covered by the patterned top electrode is oxidized or nitridized. Then, the MTJ stack is patterned to form a MTJ device wherein any sidewall re-deposition formed on sidewalls of the MTJ device is non-conductive.

BRIEF DESCRIPTION OF THE DRAWINGS

In the accompanying drawings forming a material part of this description, there is shown:

FIGS. 1, 2, 3B, and 4B illustrate in cross-sectional representation steps in a second preferred embodiment of the present disclosure.

DETAILED DESCRIPTION

For most pure physical etching processes (such as IBE), the sidewall always suffers a severe re-deposition issue since the by-products of the etched material are non-volatile. To prevent the re-deposition material around the MTJ sidewall from becoming a shunting path for the MTJ, we apply a surface treatment by oxygen to convert the potential re-deposition material from conductive to non-conductive. This step will ensure that any re-deposition is non-conductive and will not cause shunting of the MTJ devices.

Figure 1:
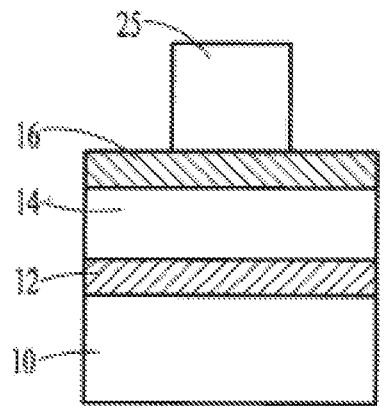
FIGS. 1, 2, 3A, and 4A illustrate in cross-sectional representation steps in a first preferred embodiment of the present disclosure.

Referring now particularly to FIGS. 1 through 4, the novel disclosure will be described in detail. A bottom electrode 12 is formed on the substrate 10, as shown in FIG. 1. Now, layers are deposited on the bottom electrode to form a magnetic tunnel junction. Layer 14 includes the MTJ layers including one or more seed layers, pinned layers, tunnel barrier layers, and free layers, as is conventional in the art. Finally a top electrode 16 is deposited on the MTJ layers 14.

Figure 2:
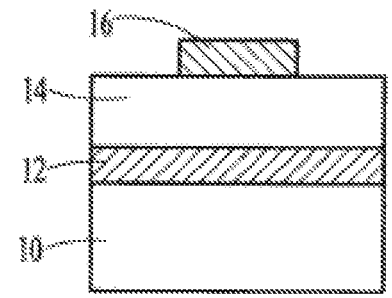

A photoresist mask 25 is formed over the top electrode. As shown in FIG. 2, the top electrode is patterned using the photoresist mask 25.

Figure 3A:
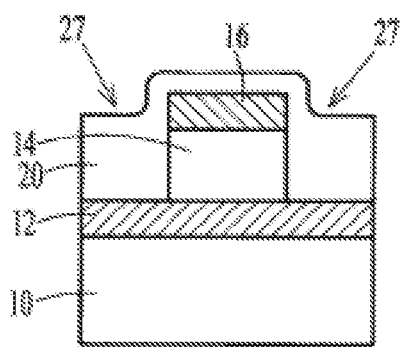

Now, an additional post treatment process is added in the middle of the etching process. After defining the top electrode 16 and before the main physical etching to define the MTJ area, preferably an oxidation treatment 27 is performed to oxidize the entire exposed MTJ area wherein the exposed MTJ area not covered by the patterned top electrode becomes oxidized 20 and therefore, non-conductive, as shown in FIG. 3A. That is, the entire stack not covered by the top electrode hard mask is oxidized, including the capping layer, free layer, pinned layer, seed layer and so on. This will ensure that all re-deposition after IBE etching will be still non-conductive to prevent any shutting path.

Oxidizing the re-deposited material after etching is undesirable because the oxygen might damage the MTJ device. It is hard to control the penetration depth of the oxide. Oxidizing prior to etching does not cause this problem because all of the oxygen will be gone after etching.

Figure 4A:
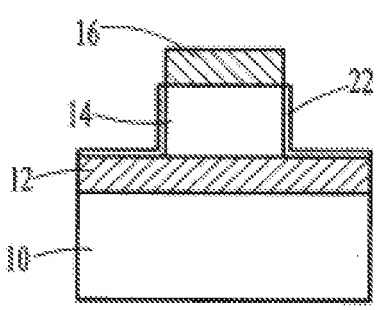

After the treatment process, a physical etching will be applied to define the MTJ area, as shown in FIG. 4A. The additional treatment will not eliminate sidewall re-deposition, but we can ensure the re-deposition material 22 will not be conductive and, thus, it will not lead to a shunting path cross the MTJ barrier. Most of the etched material should be pumped out during the etching process, but even if there is some re-deposition on the MTJ sidewall, it will not become a shutting path because it is not conductive.

Figure 3B:
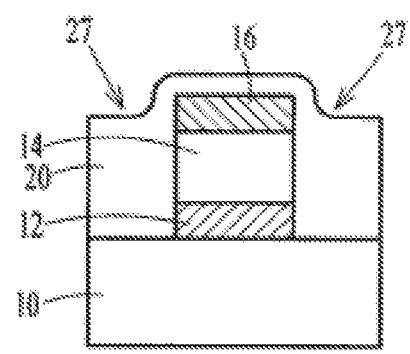
Figure 4B:
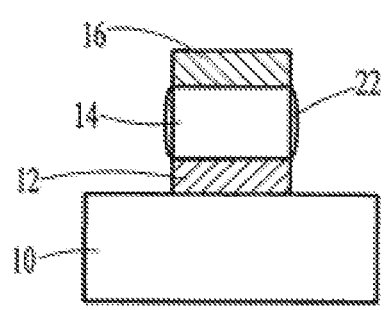

Depending on process integration, the bottom electrode could be patterned prior to depositing the MTJ layers. Or the bottom electrode could be patterned after patterning the MTJ device. We can eliminate the re-deposition shunting problem from the bottom electrode if we increase the oxidation power and/or time to oxidize the bottom electrode portion not covered by the top electrode hard mask before we perform the MTJ etching, as shown in FIG. 3B. Then, when we pattern the bottom electrode, any re-deposition 22 on horizontal surfaces of the bottom electrode layer are removed during this etching. Some re-deposition may occur on sidewalls of the MTJ stack, but this will be non-conductive material 22, as shown in FIG. 4B.

The post treatment can be applied in a variety of different ways. These can include: 1) Natural oxidation or nitridation by introducing oxygen or nitrogen gas, 2) Oxidation or nitridation with plasma assist or ion-beam assist, or 3) Treatment by a liquid such as water or a solvent. It might be necessary to apply the treatment multiple times to ensure all the metallic material in the MTJ stack is converted to oxide or nitride so that it becomes non-conductive.

In option 1, oxygen or nitrogen is introduced into a chamber containing the wafer prior to MTJ etching. If the MTJ stack is not very thick, the natural oxidation or nitridation might be enough to convert all of the MTJ stack not covered by the top electrode hard mask to a non-conductive material.

In option 2, plasma oxidation or nitridation might use pure O2, pure N2, or a mixture of O2 and N2. The plasma oxidation, nitridation, or mixed O2/N2 can optionally be performed with some noble gas such as Ar, Xe, and the like. O2 or N2 implantation could be performed to transform the material. Alternatively, O2 or N2 ion beam irradiation could perform oxidation or nitridation of the exposed layer.

In option 3, water or a solvent containing —OH or —NH, for example, could convert the exposed layers to oxides or nitrides.

Since the MTJ layers are oxidized or nitridized before performing the main physical etching, there should be no remaining oxygen or nitrogen gas in the area after MTJ etching is completed. This will mitigate oxygen or nitrogen damage to the MTJ sidewalls.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
providing a stack of material layers, the stack of material layers including:
a bottom electrode layer; and
a magnetic tunneling junction (MTJ) stack disposed on the bottom electrode layer;
converting portions of the MTJ stack and a top surface of the bottom electrode layer to a first non-conductive material layer; and
removing the first non-conductive material layer to form a patterned MTJ stack.

2. The method of claim 1, wherein the stack of material layers includes a top electrode layer disposed over the MTJ stack, and
wherein the top electrode layer is disposed over the MTJ stack during the converting of the portions of the MTJ stack and the top surface of the bottom electrode layer to the first non-conductive material layer.

3. The method of claim 1, wherein the stack of material layers includes a top electrode layer disposed over the MTJ stack, and
wherein the top electrode layer is disposed over the MTJ stack after the removing of the first non-conductive material layer to form the patterned MTJ stack.

4. The method of claim 1, further comprising:
forming a top electrode layer on the MTJ stack; and
patterning the top electrode layer.

5. The method of claim 1, wherein converting portions of the MTJ stack and the top surface of the bottom electrode layer to the first non-conductive material layer includes performing an oxidation process on the portions of the MTJ stack and the top surface of the bottom electrode layer.

6. The method of claim 1, wherein converting portions of the MTJ stack and the top surface of the bottom electrode layer to the first non-conductive material layer includes performing a nitridation process on the portions of the MTJ stack and the top surface of the bottom electrode layer.

7. The method of claim 1, wherein converting portions of the MTJ stack and the top surface of the bottom electrode layer to the first non-conductive material layer includes applying oxygen and nitrogen.

8. The method of claim 7, wherein the applying of oxygen and nitrogen further includes applying a noble gas selected from the group consisting of Ar and Xe.

9. A method comprising:
providing a stack of material layers, the stack of material layers including:
a bottom electrode layer; and
a magnetic tunneling junction (MTJ) stack disposed on the bottom electrode layer;
applying a liquid to portions of the MTJ stack to convert the portions to a first non-conductive material layer, wherein the liquid is a solvent that includes a material selected from the group consisting of a hydroxyl group and an amine group; and
removing the first non-conductive material layer to form a patterned MTJ stack, wherein the removing of the first non-conductive material layer to form the patterned MTJ stack includes a portion of the first non-conductive material layer being redeposited on the patterned MTJ stack.

10. The method of claim 9, wherein the removing of the first non-conductive material layer to form the patterned MTJ stack includes performing a physical etch process.

11. The method of claim 9, wherein the MTJ stack includes a seed layer, a pinned layer, a tunnel barrier layer and a free layer, and
wherein at least a portion of each of the seed layer, the pinned layer, the tunnel barrier layer and the free layer is converted to the first non-conductive material layer after the applying of the liquid to the portions of the MTJ stack.

12. A method comprising:
forming a magnetic tunneling junction (MTJ) stack on a bottom electrode disposed over a substrate, the MTJ stack having a top surface facing away from the substrate;
converting portions of the MTJ stack, including the top surface of the MTJ stack, to a first non-conductive material layer, wherein a portion of the bottom electrode is converted to a second non-conductive material layer during the converting of portions of the MTJ stack, including the top surface of the MTJ stack, to the first non-conductive material layer; and
removing the first non-conductive material layer to form a patterned MTJ stack.

13. The method of claim 12, wherein the first non-conductive material layer includes an oxide of a material of the MTJ stack, a nitride of the material of the MTJ stack, or a combination thereof.

14. The method of claim 12, wherein the converting of the portions of the MTJ stack, including the top surface of the MTJ stack, to the first non-conductive material layer includes performing a plasma process.

15. The method of claim 12, wherein the converting of the portions of the MTJ stack, including the top surface of the MTJ stack, to the first non-conductive material layer includes performing an ion beam irradiation process.

16. The method of claim 12, further comprising forming the bottom electrode on the substrate, and
wherein the second non-conductive material layer interfaces with the substrate.

17. The method of claim 12, wherein the converting portions of the MTJ stack, including the top surface of the MTJ stack, to the first non-conductive material layer includes applying a liquid to portions of the MTJ stack to convert the portions to the first non-conductive material layer.

18. The method of claim 9, wherein the applying of the liquid to portions of the MTJ stack includes applying the liquid to the bottom electrode layer.

19. The method of claim 9, wherein the first non-conductive material layer includes a material selected from the group consisting of an oxide of a material of the MTJ stack and a nitride of the material of the MTJ stack.

20. The method of claim 9, wherein the providing of the stack of material layers includes providing the stack of material layers on a substrate, and wherein a portion of the substrate is exposed after the removing of the first non-conductive material layer to form the patterned MTJ stack.

\* \* \* \* \*